United States Patent [19]

Matsue

[11] 4,395,764
[45] Jul. 26, 1983

[54] MEMORY DEVICE UTILIZING SHIFT REGISTERS FOR DATA ACCESSING

[75] Inventor: Shigeki Matsue, Tokyo, Japan

[73] Assignee: Nippon Electric Co., Ltd., Tokyo, Japan

[21] Appl. No.: 221,106

[22] Filed: Dec. 29, 1980

[30] Foreign Application Priority Data

Dec. 27, 1979 [JP] Japan .................................. 54-170712

[51] Int. Cl.³ ........................ G11C 7/00; G11C 19/00
[52] U.S. Cl. ..................................... 365/78; 365/189; 365/221; 365/240; 377/54; 377/67
[58] Field of Search ................... 365/78, 80, 189, 221, 365/240; 307/221 R; 235/92 SH

[56] References Cited

U.S. PATENT DOCUMENTS

| | | | |
|---|---|---|---|
| 3,731,287 | 5/1973 | Seely et al. | 365/78 |
| 3,851,313 | 11/1974 | Chang | 365/240 X |
| 3,893,088 | 7/1975 | Bell | 365/78 |
| 4,330,852 | 5/1982 | Redwine et al. | 365/221 |

Primary Examiner—Robert L. Richardson
Attorney, Agent, or Firm—Sughrue, Mion, Zinn, Macpeak & Seas

[57] ABSTRACT

A memory device which is effectively utilized as serial access memory with variable shift length of stored data is disclosed. The memory device comprises memory cells arrayed in a matrix form, a shift register whose output is used for selecting memory cells and control means for varying shift length of the shift register.

13 Claims, 20 Drawing Figures

MEMORY DEVICE UTILIZING SHIFT REGISTERS FOR DATA ACCESSING

BACKGROUND OF THE INVENTION

The present invention relates to a memory device, and more particularly to a monolithic semiconductor memory device formed on a semiconductor substrate.

As is well known, memory devices are generally classified, with respect to the mode of access, into the so-called random access memories and the so-called serial access memories. The random access memory is constructed in such manner that memory cells are arrayed in a matrix form and peripheral circuits such as address inverters and decoders are disposed along the periphery of the matrix. In such type of random access memory, since each memory cell is formed of one transistor and one capacitor, a memory matrix having a large memory capacity can be constructed at a high density. However, contrary to the tendency of high-density integration of a memory cell matrix, in a peripheral circuit such as a decoder, the number of input transistors of a NOR gate corresponding to one word line or one digit line, is increased in proportion to the enlargement of memory capacity of the memory matrix. In other words, the number of elements necessitated for a peripheral circuit per one word line or one digit line is rapidly increased in accordance with the increase in a memory capacity. Consequently, the proportion of the area occupied by memory cells on a semiconductor chip is greatly restricted, and hence it has been difficult in the prior art to provide a memory device having a large memory capacity with a small chip area.

On the other hand, among the serial access memories, a shift register has been well known as a typical example. In the case of the shift register, although a peripheral circuit such as a decoder or the like is unnecessary, a memory unit of one bit is constructed by cascading two stages of inverters each provided with a sampling gate transistor. Accordingly, at least six transistors per one bit are necessary, and hence, in the event of a large memory capacity, a great many transistors are necessitated. In other words, realization of a serial access memory having a large memory capacity has been not practicable in the prior art.

For instance, a shift register employing MOS FET's is a most common one, and substantially every semiconductor manufacturer in the world has developed and sold various shift registers. The number of bits in such a shift register was fixed at the time point when it was designed and completed. In the event that different shift lengths of the shift register were required depending upon the use, one had to fulfill such a requirement by preparing a plurality of shift registers having different shift-lengths. However, as the number of systems making use of shift registers is increased, it has become difficult to fulfill all these requirements. Hence this problem has been dealt with by standardizing the lengths of the available shift registers on the side of the system designers.

Nevertheless, in some systems, a requirement has arisen that the length of a shift register should not be fixed, but it is desired to control the shift-length of the shift register depending upon the situation.

In the field of audio equipments which handle analog signals, a delay circuit has been used in an echo device or the like, and it was desired to provide an echo device in which the length of an echo can be freely controlled.

Heretofore, in one method for making a delay time of an analog signal variable, an analog delay circuit, for example a BBD (Bucket Brigade Device) was employed and the delay time was controlled by varying a sampling period. However, in the system of varying a sampling period, the width of the delay control was limited, and also the variation of the sampling period affected the precision of the signal.

In addition, recently, with the progress of the technique of digitally processing a signal, especially an analog signal, as is the case with a digital filter, the necessity for a large-capacity memory device, especially a large-capacity serial access memory has been enhanced.

SUMMARY OF THE INVENTION

It is therefore one object of the present invention to provide a memory device having a large memory capacity.

Another object of the present invention is to provide a memory device which is available either as a random access memory or as a serial access memory.

Still another object of the present invention is to provide a serial access memory device having a large memory capacity and a variable shift length.

The memory device according to the present invention is basically characterized in that memory cells arrayed in a matrix form are used as a memory section and a shift register is used as a circuit for addressing this matrix. In this memory device, the respective addresses in the memory matrix are selected by applying a single selection signal to the shift register and successively shifting this single selection signal in synchronism with a shift control signal. By starting the shift in the above-described shift register from an arbitrary bit and/or terminating the shift at any arbitrary bit, a shift register having a large capacity and a variable shift length can be provided, whose shift length is determined by the start bit position and/or the terminated bit position.

In the present invention, the mentioned shift register may be provided to either rows or columns and addressing of rows or columns is performed in the mentioned manner. It is further effective to provide shift registers for both rows and columns.

The memory device according to the present invention can be used as a random access memory with variable memory capacity as well as the serial access memory by controlling shift quantity of the shift register from the outside.

The memory of the present invention is effectively used as delay means such as for delaying audio or video signals.

According to one feature of the present invention, there is provided a serial access memory device including memory cells arrayed in a matrix form of M rows and N columns, an M-bit X shift register and an N-bit Y shift register for addressing said memory cells, and a shift control circuit and a shift register initial set circuit for controlling said shift registers, said X shift register and Y shift register having the functions of being set at their initial positions, respectively, in response to the initial set signals INTX and INTY respectively for the X and Y shift registers, which memory device operates as a serial access memory by means of shift pulses $\phi$, and in which the length of the serial access memory can be controlled depending upon a period of a control signal applied externally.

According to another feature of the present invention, there is provided a memory device including memory cells arrayed in a matrix form of M rows by N columns, an X shift register and a Y shift register for addressing said memory cells, a shift control circuit for controlling these shifts registers, a counter circuit for counting shift pulses $\phi$, a shift register set circuit for designating a shift length of the shift register, and a coincidence detector circuit for comparing the output of the counter circuit and the output of the shift register set circuit to detect coincidence between the respective outputs and then generate an initial set signal, said X shift register and Y shift register having the functions of being set at their initial positions, respectively, in response to the initial set signal.

According to still another feature of the present invention, there is provided a memory device including memory cell matrix of M rows and N columns, an X shift register for addressing the rows and a Y shift register for selecting the columns, a shift control circuit for controlling these X and Y shift registers, and a counter coincidence detector circuit for counting shift pulses to detect coincidence between the count and a shift length designation signal applied externally and then generate a shift register initial set signal, said X shift register and Y shift register having the functions of being set at their initial positions, respectively, in response to the initial set signal, whereby the shift length can be designated by said shift length designation signal applied externally.

According to yet another feature of the present invention, there is provided a memory device including memory cells arranged in a matrix form of M rows·N columns, an X shift register and a Y shift register both for selecting said memory cells, a shift control circuit for controlling these shift registers, a programmable register, and a shift register initial set control circuit for counting shift pulses to detect coincidence between the count and the output of the programmable register and then generate a shift register initial set signal, said X shift register and Y shift register having the functions of being set at their initial positions, respectively, in response to the initial set signal, whereby the shift length can be made programmable.

According to a further feature of the present invention, there is provided a memory device including memory cell matrix of M rows by N columns, an X shift register and a Y shift register for selecting rows and columns of said memory cells, and a field-programmable logic circuit for controlling the operations of these shift registers and counting shift pulses to generate an initial set signal according to programmed instructions, said X shift register and Y shift register being adapted to be set at their initial positions in response to the initial set signal.

According to a still further feature of the present invention, there is also provided a memory system comprising a serial access memory circuit having a variable shift length, which includes memory cells arrayed in a matrix form of M rows·N columns, an X shift register and a Y shift register for selecting said memory cells, and a control circuit for controlling these shift registers, an analog to Digital (A/D) converter circuit for A/D-converting an external input and delivering the converted input to said serial access memory circuit, and a digital to analog (D/A) converter circuit for D/A-converting the output of said serial access memory circuit and externally delivering the converted output.

The essence of the present invention resides in that a random access memory (RAM) is used as a basic component and a peripheral control circuit is newly constructed so that the memory can be used as a serial access memory whose shift length can be freely controlled externally. Furthermore, this novel memory can be also used as a delay circuit in which a delay time for an analog signal can be controlled arbitrarily.

According to the present invention, a peripheral circuit which has heretofore occupied a large proportion of the area in a memory device in the prior art, especially an address circuit and its relevant circuits, can be greatly reduced in size, and hence, enlargement of a memory capacity of a memory device can be realized.

Furthermore, according to the present invention, a serial access memory having a large memory capacity can be realized.

Moreover, according to the present invention, a number of address input terminals can be widely reduced, and therefore, a number of external terminals of a memory IC can be greatly reduced.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
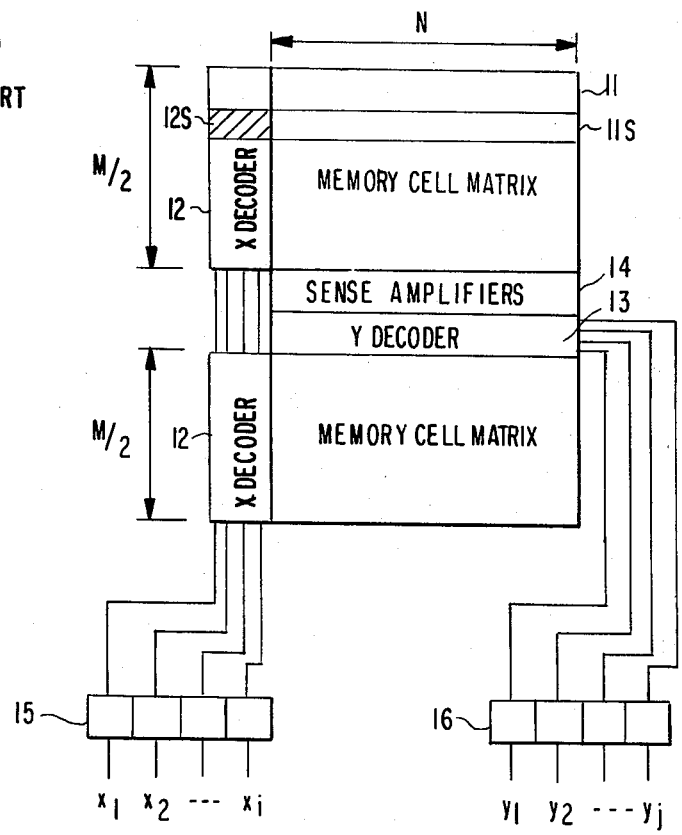
FIG. 1 is a schematic diagram showing one example of a general construction of a conventional RAM of (M×N) words×1 bit.

At first, a random access memory in the prior art will be desired with reference to FIG. 1.

FIG. 1 shows one example of a construction of a RAM of (M×N) words×1 bit. The RAM could be assumed to be either a static RAM or a dynamic RAM. Memory cells are arrayed in the form of a matrix 11 of M rows by N columns (in the illustrated example, divided into two matrices of M/2×N), and the M rows and N columns are respectively associated with an X-decoder circuit 12 and a Y-decoder circuit 13. The X-decoder 12 is called a "word decoder", while the Y-decoder 13 is called a "digit decoder", and they are fed with address data from an X-address buffer 15 and a Y-address buffer 16, respectively. If one decoder section 12S in the X-decoder circuit 12 is selected, then N memory cells connected to this decoder section are simultaneously accessed. Hence, the data of N bits are all called out to sense amplifiers in a parallel form. The Y-decoder circuit 13 serves to select one out of the N data called out in a parallel form, so that externally this memory appears to be a RAM of (M×N) words×1 bit. One example of such a memory is described in detail in U.S. Pat. No. 3,969,706.

In FIG. 1, the X-decoder circuit 12 and the Y-decoder circuit 13 are respectively controlled by i X-address input signals consisting of signals $X_1$-$X_i$ and j Y-address input signals consisting of signals $Y_1$-$Y_j$, and the following relations are fulfilled:

$$M=2^i$$

$$N=2^j$$

In the RAM shown in FIG. 1, although the memory cells can be accessed in an arbitrary sequence as controlled by the address input, it necessitates an X-decoder, a Y-decoder, an X-address buffer, a Y-address buffer and additional more complex circuits. On the other hand, a RAM has many uses in which memory cells are accessed always in a fixed sequence. But, even in such uses, the respective peripheral circuits must carry out a series of operations successively on the basis of address data for each read out process, and hence it was difficult to read out the information stored in the memory at a high speed.

Now a basic construction of a memory device according to the present invention will be described with reference to FIG. 2.

Figure 2:
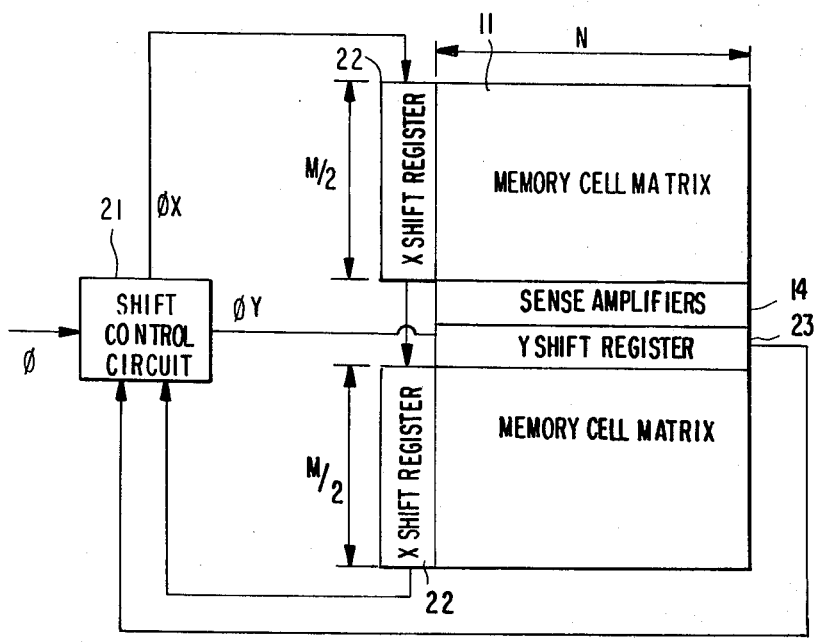
FIG. 2 is a schematic diagram showing one example of a known construction of a memory circuit, in which an X-decoder and a Y-decoder in FIG. 1 are respectively replaced by an M-bit shift register and an N-bit register, and owing to an action of a shift control circuit the memory circuit can operate as a serial access memory of M×N bits.

FIG. 2 shows a memory device in which the X-decoder circuit and the Y-decoder circuit in FIG. 1 are replaced by shift registers 22 and 23, respectively. A shift input signal $\phi$ is applied externally in place of the address input signals, and in this memory device, the sequence for access to the respective memory cells is fixed. However, the decoder circuits become simpler owing to the replacement by the shift registers, thus the number of signals to be applied externally is also reduced to only one shift input signal in lieu of the plurality of address signals. Therefore, the saving of the number of terminal pins is remarkable.

In the following description, the X-address corresponds to a refresh address, that is, an address of a word line, while the Y-address corresponds to an address of a digit line. The X shift register 22 has M-bit parallel outputs and is divided into two sections respectively corresponding to the two matrices of M/2×N, and the respective outputs are coupled to the corresponding word lines in the memory cell matrix 11. The Y shift register 23 has N-bit parallel outputs, and these outputs are used for selection of the digit lines.

Shift of the X shift register is controlled by X shift pulses $\phi_x$ which are generated by a shift control circuit 21 in response to a shift signal $\phi$ applied from the outside. This shift register 22 operates in such manner that among the M-bit parallel outputs only one output takes a selection level. For instance, in an N-channel MOS transistor construction, information "1" is successively shifted from the input stage to the final stage, and this single information "1" is shifted in synchronism with the X shift pulses $\phi_x$. Accordingly, after a power supply for the memory has been switched on or before the operation, it is necessary to set the X shift register in an initial condition such that only one bit can take a selection level and the other bits take an unselection level.

The Y shift register 23 is likewise controlled by Y shift pulses $\phi_Y$, and it is constructed in such manner that a single "1" level may be successively shifted. Here, it is to be noted that with regard to the circuit components other than the X shift register and Y shift register, such as a memory cell matrix, a sense amplifier and data input/output circuits, those disclosed in U.S. Pat. No. 3,969,706 can be used in themselves. In addition, the detailed constructions of the shift registers 22 and 23 should not be limited in any way, but the well-known construction as disclosed, for example, in U.S. Pat. Nos. 3,648,066, 2,599,010 or 3,621,279 could be employed under the above-described operating condition. Here it is to be noted that although the shift pulses $\phi_X$ and $\phi_Y$ are respectively represented as single pulse series for convenience of illustration, generally they could take the form of multi-phase clock pulses.

Figure 3:
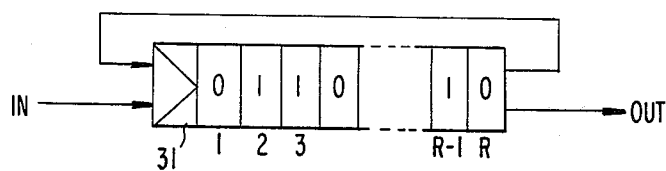
FIG. 3 is a schematic diagram showing one example of a prior art general construction of an R-bit shift register.

FIG. 3 shows a normal N-bit shift register, in which a signal applied from an external input IN through an input control circuit 31, is stored within the shift register and is shifted within the shift register. Hence, the numbers of "1" and "0" within the shift register are different depending upon the input signal.

Figure 4:
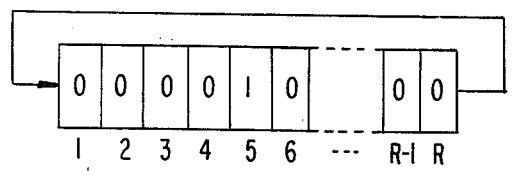
FIG. 4 is a schematic diagram showing one example of a prior art construction of an R-bit shift register in which provision in made such that only one bit can be "1" and the remainders are "0"
Figure 5:
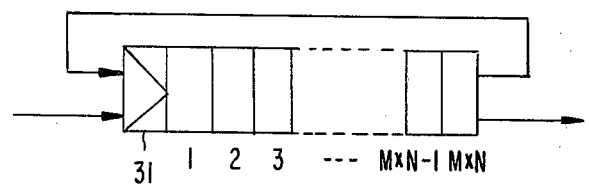
FIG. 5 is a schematic diagram to be used for explaining a known M×N-bit shift register, whose construction is effectively equivalent to the serial access memory illustrated in FIG. 2.

FIG. 4 shows a shift register in which only one bit can be "1" and the remaining bits are all "0". In this shift register, the externally applied signal does not control the internal information, but merely controls the position where "1" is stored. In the case of a circuit which is required to select only one, such as a decoder circuit of a memory, it is necessary to replace the shift register as shown in FIG. 4 for the decoder, and hence, the X shift register and Y shift register to be used in the serial access memory shown in FIG. 2 are shift registers of the type shown in FIG. 4. Accordingly, as viewed externally, the serial access memory shown in FIG. 2, eventually looks like an M×N-bit register as shown in FIG. 5. In addition, the serial access memories as shown in FIG. 2 are divided into two types depending upon the control method employed by the shift control circuit 21.

Figure 6:
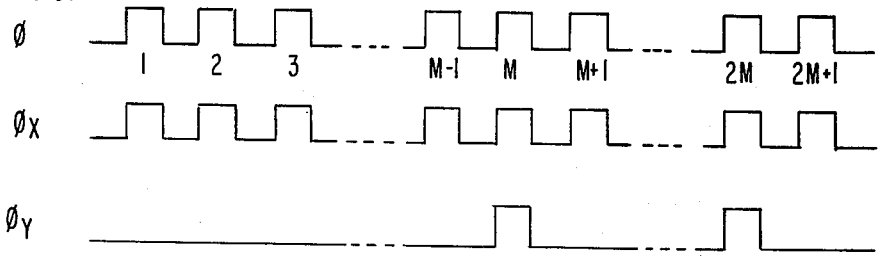
FIG. 6 is a schematic diagram showing one example of a known control method employed in the shift control circuit included in the construction of the serial access memory illustrated in FIG. 2, in which method the X shift register is used as a less significant digit and is stepped by one bit per cycle an synchronized with the externally applied shift pulses, and when the X shift register has gone its one round, the Y shift register is stepped by one bit.

FIG. 6 shows one example of the shift control method in the memory of FIG. 2. This shift control method is of such type that shift pulses $\phi_X$ for the X shift register are generated in synchronism with an externally applied shift input $\phi$ each time the shift input arises, and when the X shift register has gone its one round, one shift pulse $\phi_Y$ for the Y shift register is generated, whereby the Y shift register is advanced by one step.

Figure 7:
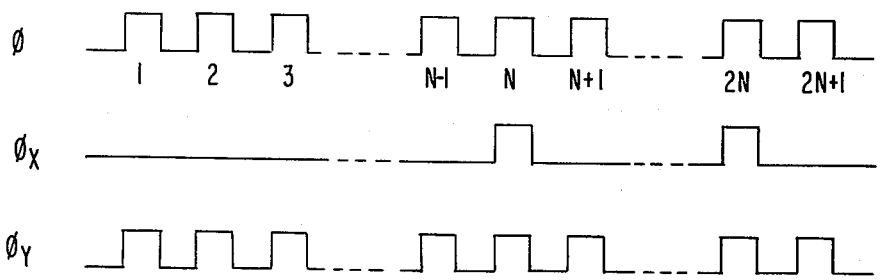
FIG. 7 is a schematic diagram showing another example of a known control method employed in the shift control circuit included in the construction of the serial access memory illustrated in FIG. 2, in which method the Y shift register is used as a less significant digit and is stepped by one bit per cycle, and when the Y shift register has gone its one round, the X shift register is stepped by one bit.

FIG. 7 shows another example of the shift control method. This shift control method is of such type that shift pulses $\phi_Y$ for the Y shift register are generated in synchronism with an externally applied shift input $\phi$ each time the shift input arises, and when the Y shift register has gone its one round, one shift pulse $\phi_X$ for the X shift register is generated, whereby the X shift register is advanced by one step. This example corresponds to so-called page mode operation.

For example, in the case where the memory cell matrix in FIG. 2 consists of MOS dynamic cells (such as one-transistor type memory cells), if circulation is made with the X shift register used as a less significant digit, then all the bits are refreshed in M cycles. Therefore, refresh can be effected always perfectly even in the case of a fairly long cycle time, so that there is no need to worry about a hold time for data.

In the case of the second shift control method illustrated in FIG. 7, after one word of data has been selected and read out by the X shift register, it is only necessary to switch the route for the data read out through the sense amplifier and fed to the output. Therefore, during the cycle of N bits it is possible to operate at a higher speed than during the normal cycle. Which one of the shift control methods illustrated in FIGS. 6 and 7, respectively, should be employed, depends upon the use of the serial access memory.

Figure 8:
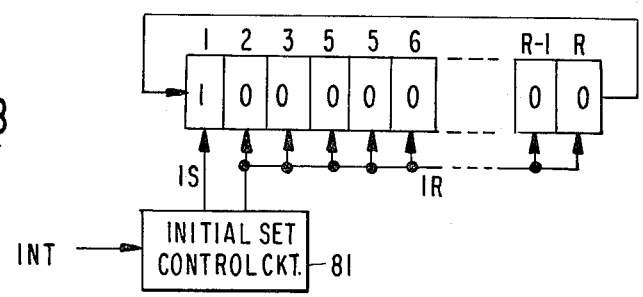
FIG. 8 is a schematic diagram showing a known R-bit shift register having the functions necessitated according to the feature of the present invention.

FIG. 8 shows a detailed shift register that is necessitated for the memory construction according to the present invention. Basically, this shift register is similar to that shown in FIG. 4, in which among R bits only one bit is always "1" and the remaining bits are all "0".

The difference from the shift register shown in FIG. 4 exists in that the shift register shown in FIG. 8 includes input terminals for a set signal IS and a reset signal IR and a control circuit 81 for these signals, so that when an initial set signal INT is applied externally to the shift register, "1" can be set at a predetermined bit position (for example at the position of bit 1) and the other bits can be all reset to "0". In other words, if the initial set signal INT is applied externally, then the shift register can be restored to a predetermined bit position.

Figure 9:
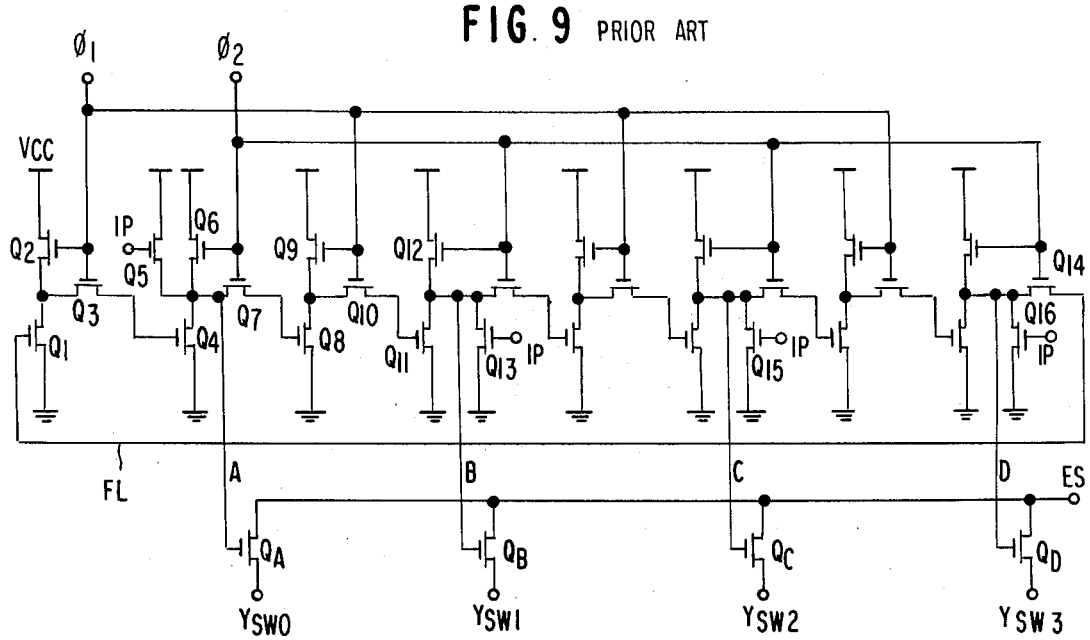
FIG. 9 is a circuit diagram showing one practical example of the shift register illustrated in FIG. 8.

One practical example of the shift register of FIG. 8 will be explained with reference to FIG. 9, by way of example, in connection to the case of a 4-bit construction.

Here, the description will be made on the example of the shift register employing N-channel MOS transistors. In FIG. 9, MOS transistors $Q_1$ to $Q_6$ form a first stage memory bit, MOS transistors $Q_7$ to $Q_{13}$ form a second stage memory bit, and third and fourth stage memory bits are constructed similarly to the second stage memory bit. The output of the fourth stage is fed back through a feedback line FL to a feedback input of the first stage, and control pulses $\phi_1$ and $\phi_2$ are practical examples of the control pulses $\phi_X$ and $\phi_Y$ in the preceding general description. The pulses $\phi_1$ have a sampling function for the shift, and the pulses $\phi_2$ achieve activation of the output data. For the pulses $\phi_1$ for example, an inverted signal of the clock pulses $\phi_X$ is available, and for the pulses $\phi_2$ the clock pulses $\phi_Y$ themselves can be used. Or else, the pulses $\phi_1$ and $\phi_2$ could be produced in such manner that the pulse $\phi_1$ may be changed to a high level when a column address strobe CAS as used in the dynamic memory disclosed, for example, in U.S. Pat. No. 3,969,706 changes from a high level to a low level, while the pulse $\phi_2$ may be held at a high level for a predetermined period when the CAS changes from a low level to a high level.

In the illustrated example, with respect to the first stage bit, a transistor $Q_5$ adapted to be applied with an initial set pulse IP to its gate, is provided between a first stage output A and a power supply $V_{cc}$, whereas with respect to the second and subsequent stage bits, transistors $Q_{13}$, $Q_{15}$ and $Q_{16}$ adapted to be applied with the initial set pulse IP to their gates, are provided between the outputs B, C and D of the respective stages and the ground. After the power supply for the memory device has been switched on or before access operation, the initial set pulse IP is generated in one shot to make these transistors $Q_4$, $Q_{12}$, $Q_{15}$ and $Q_{16}$ conduct, and thereby only the output A is forcibly set at a high level and the other outputs B, C and D are forcibly set at a low level. The respective outputs A, B, C and D of the shift register are connected to Y-select gate terminals $Y_{SW0}$ to $Y_{SW3}$ through source-follower transistors $Q_A$ to $Q_D$ having a drive signal ES applied to their drains. In the case of a light load, of course, the outputs A, B, C and D could be connected directly to the Y-select gate terminals $Y_{SW0}$ to $Y_{SW3}$. In this embodiment, a single pulse IP EP is used for set and reset of the stages of the shift register in place of employing the set pulse IS and the reset pulse IP of FIG. 8.

Figure 10:
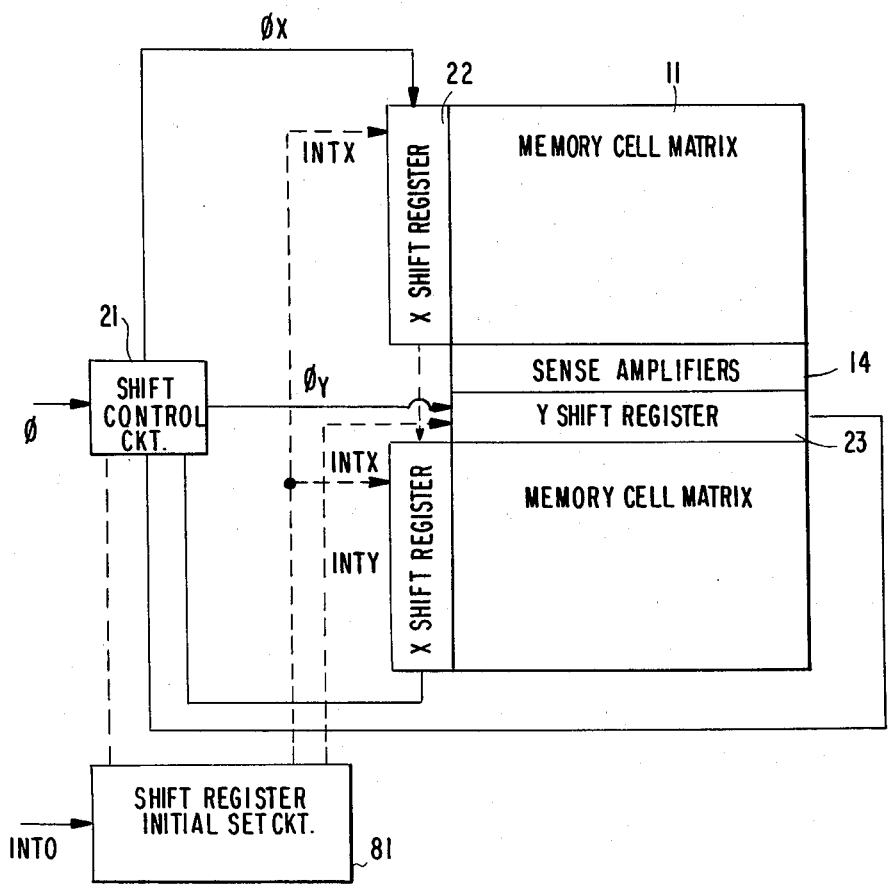
FIG. 10 is a schematic diagram showing one preferred embodiment of the present invention to illustrate the basic principle of the invention.

In FIG. 10 is illustrated a basic circuit of the memory device according to the present invention in which the serial access memory shown in FIG. 2 is constructed by employing the shift register provided with the initial set control circuit as explained with reference to FIG. 8. When an initial set signal INTO is applied externally, a shift register initial set control circuit 81 generates an X shift register initial set signal INTX and a Y shift register initial set signal INTY, so that both the X shift register 22 and the Y shift register 23 can be set at certain predetermined positions (for example, at the #0 address position).

Figure 11:
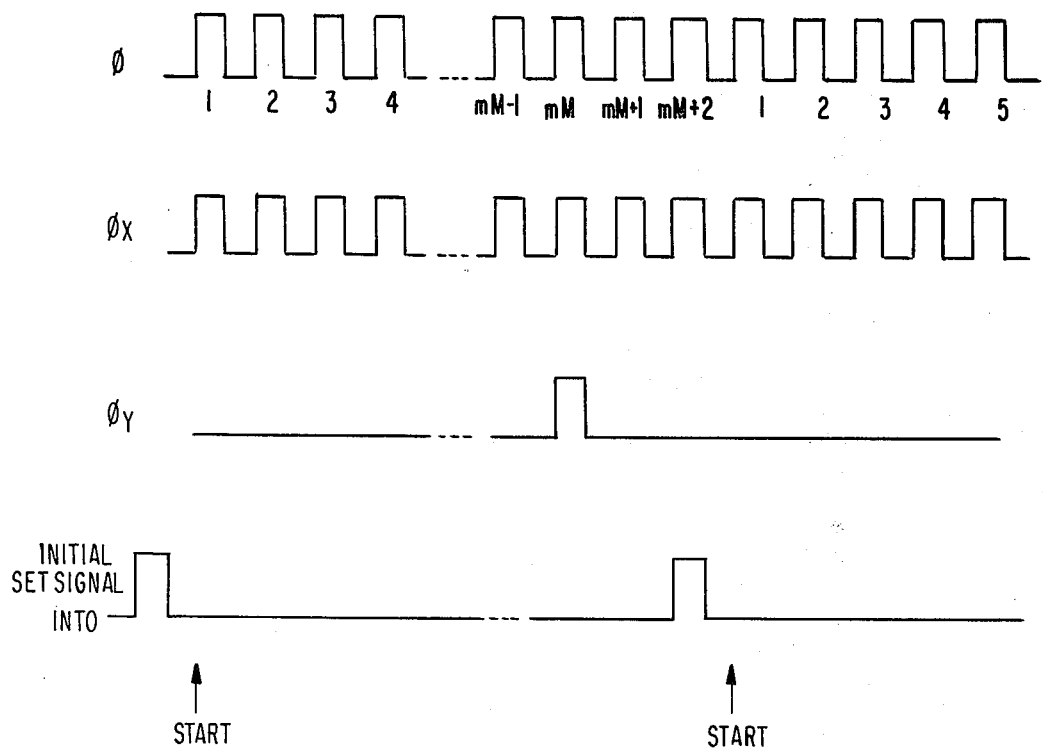
FIG. 11 shows timing waveforms to be used for explaining a control system in the initially settable serial access memory circuit shown in FIG. 10.

A timing chart to be used for explaining such timing relations is shown in FIG. 11. FIG. 11 shows one example of the first shift control method illustrated in FIG. 6, in which in response to the shift input $\phi$, the X register shift pulse $\phi_X$ is generated for each shift input pulse $\phi$ in synchronism thereto, whereas the Y register shift pulse $\phi_Y$ is generated once for M shift input pulses $\phi$ in synchronism thereto. During such shift operations, if the initial set signal INTO is applied at the (mM+2)-th cycle point, then the next cycle is not the (mM+3)-th cycle, but the shift operation returns to the 1st cycle at the start point and commences new cycles. This implies that the memory circuit operating as a serial access memory did not shift to the final (M×N)-th bit, but interrupted the shift operation at the (mM+2)-th bit.

Viewing from a different stand point, in the serial access memory circuit shown in FIG. 10, the bit length of the serial access memory normally having a length of M×N bits can be varied by externally controlling the time point when the initial set signal INTO is applied. For instance, if the initial set signal INTO is applied at the (6M+4)-th bit, then the shift register looks like a shift register having a length of (6M+4) bits, and if the initial set signal INTO is applied generally at the (pM+q)-th bit, then it becomes a shift register having a length of (pM+q) bits. Such type of serial access memory may be called "variable-length serial access memory circuit".

The basic feature of the memory construction illustrated in FIG. 10 exists in the use of the initially settable shift register circuits in place of the decoder circuits in the prior art, and the provision of the shift control circuit for controlling the two, X and Y shift registers, and the shift register initial set circuit for initially setting the shift registers as synchronized with the shift control circuit in response to the initial set signal which is applied externally.

Figure 12:
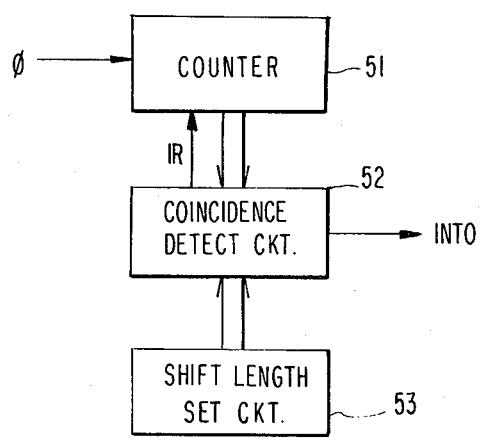
FIG. 12 is a schematic block diagram to be used for explaining a method of generating an initial set signal INTO as will be described with reference to FIG. 10.

FIG. 12 shows one example of a circuit operable to generate the initial set signal. In this circuit, a counter 51 counts shift pulses $\phi$, and when the count in the counter 51 has coincided with the value set in a shift register length set circuit 52, a coincidence detector circuit 52 detects this coincidence and then generates the initial set signal INTO. With regard to this shift register length set circuit 52, various types could be used practiced as explained later.

Figure 13:
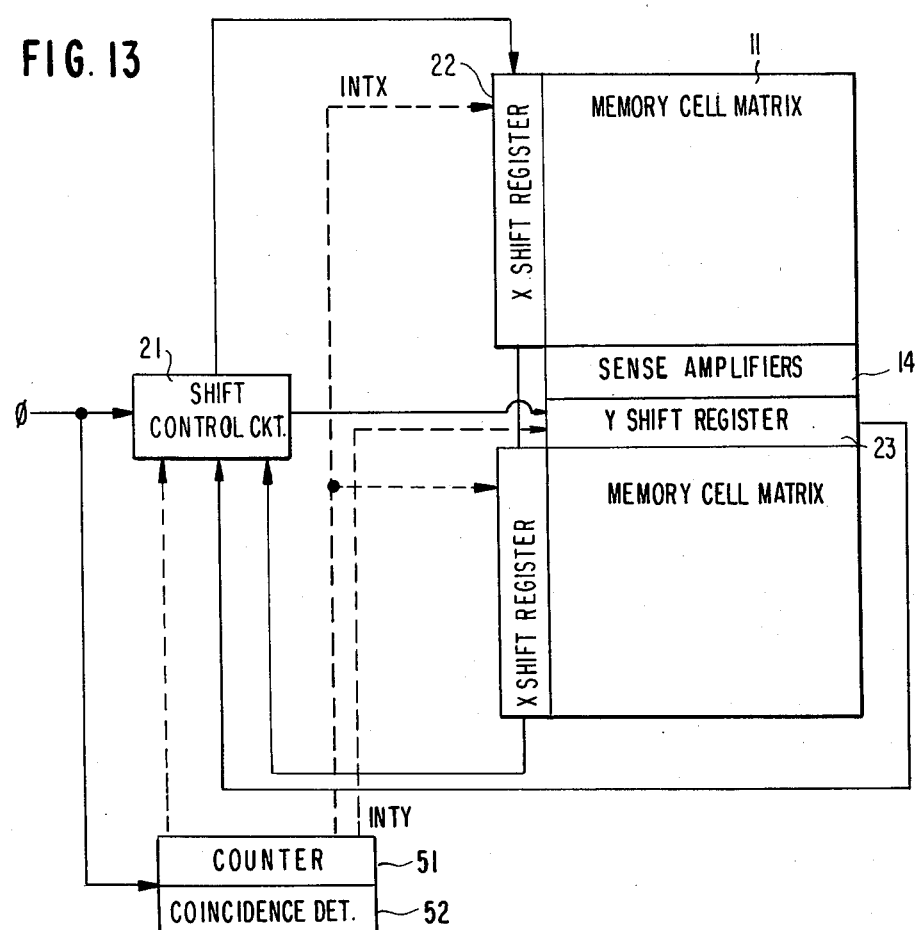
FIG. 13 is a schematic diagram showing a modified preferred embodiment of the present invention in which the basic circuit according to the present invention as illustrated in FIG. 10 is somewhat modified.

FIG. 13 shows a method for controlling a shift length by externally applying a shift length designation input signal (LC) in a binary form. In this case, if the shift length designation input (LC) is held for a period at a certain fixed value, then the length of the shift register is fixed at a certain value during that period. If the shift length designation input is varied, then the length of the shift register as viewed externally would vary. Depending upon the memory systems, in some cases once the shift register length has been set it could be kept fixed, but in other cases the memory system requires varying the shift register length occasionally.

Figure 14:
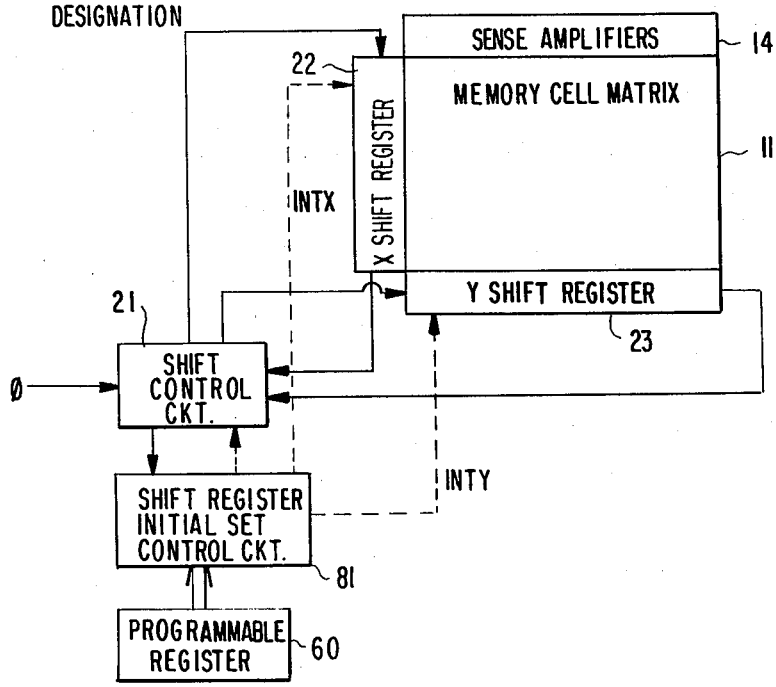
FIG. 14 is a schematic diagram showing another preferred embodiment of the present invention.

FIG. 14 shows a memory device in which a programmable register 60 (for instance, one type of PROM) is employed as the initial set input circuit. If the contents of the programmable register 60 are programmed at a certain value, then the length of the shift register is set at the programmed value, and subsequently the shift register length is held fixed without applying any shift register length control signal externally. In the case where the shift register lengths are different for the respective memory systems but the shift register length could be fixed for each individual system, the illustrated embodiment of the invention is effective.

Figure 15:
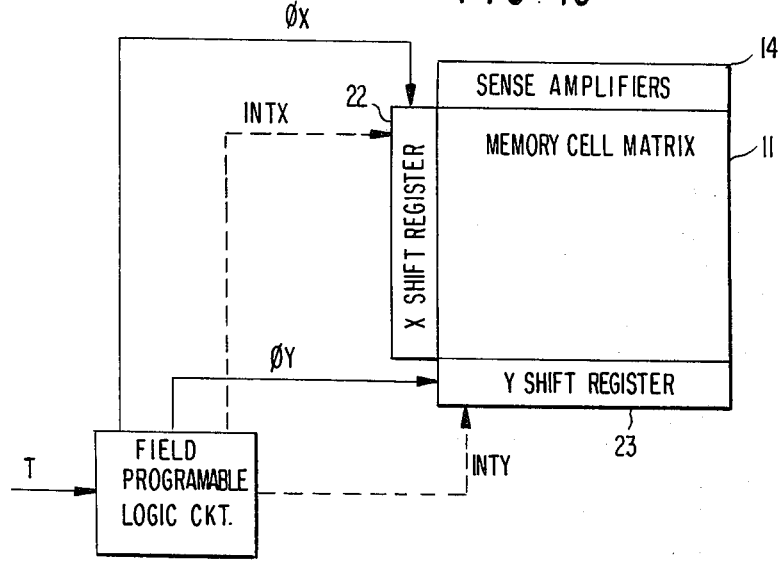
FIG. 15 is a schematic diagram showing still another preferred embodiment of the present invention.

FIG. 15 shows another preferred embodiment of the memory device according to the present invention, in which the shift control circuit, shift register initial set control circuit, programmable register, etc. in FIG. 14 are assembled into one unit, that is, into a field-programmable logic circuit 61 (commonly called FPLA by those skilled in the art), which is controlled by a timing signal T. This is one preferred embodiment for simplifying the entire construction and taking into consideration a versatility in the field.

Figure 16:
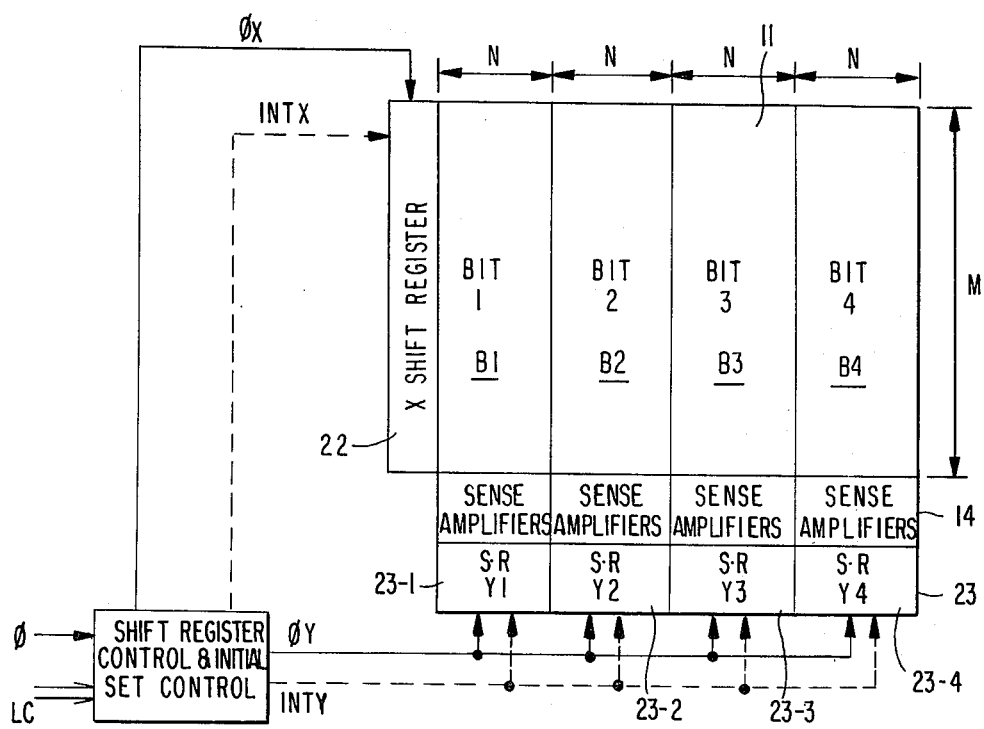
FIG. 16 is a schematic diagram showing yet another preferred embodiment of the present invention.

A construction of a variable-length shift register in which a plurality of bits shift in parallel, is illustrated in FIG. 16. For instance, in the case of four bits in parallel, four N-bit Y shift registers $Y_1-Y_4$ are arrayed in parallel in the illustrated construction, and hence, as viewed externally, it looks substantially like a shift register shown in FIG. 17.

Now description will be made on the write (Data In)-read (Data Out) operations of the variable-length serial access memory according to the present invention. According to the present invention, the distance between the "Data In" and the "Data Out" is important, and this corresponds to a delay time. The positions of the "Data In" and the "Data Out" are fixed similarly to the conventional RAM. According to the present invention, data store in the memory cells accessed by the X-register and Y-register are read out, and immediately new data are written therein. In other words the memory operates continuously in a Read-Modify-Write mode. For instance, during the period when one word is kept selected by the X-register, while the memory cells in the selected words are being successively accessed by the Y-register and data are being read out of them, new data are successively written in the memory cells. In the prior art, the data written through the above-mentioned operations would be read out after the X-register had gone its one round, and hence, there exists a time delay corresponding to the period when the X-register is made to go its one round while making the Y-register go its one round for each word. However, according to the present invention, the serial access memory can be made to have a variable length by controlling the above-mentioned delay time as a result of arbitrarily controlling the lengths of the X-register and Y-register. Accordingly, in the memory device according to the present invention, the read circuit and write circuit for the "Data In" and "Data Out" need not have any special construction, but then can be realized by means of the conventional read/write circuit.

Figure 17:
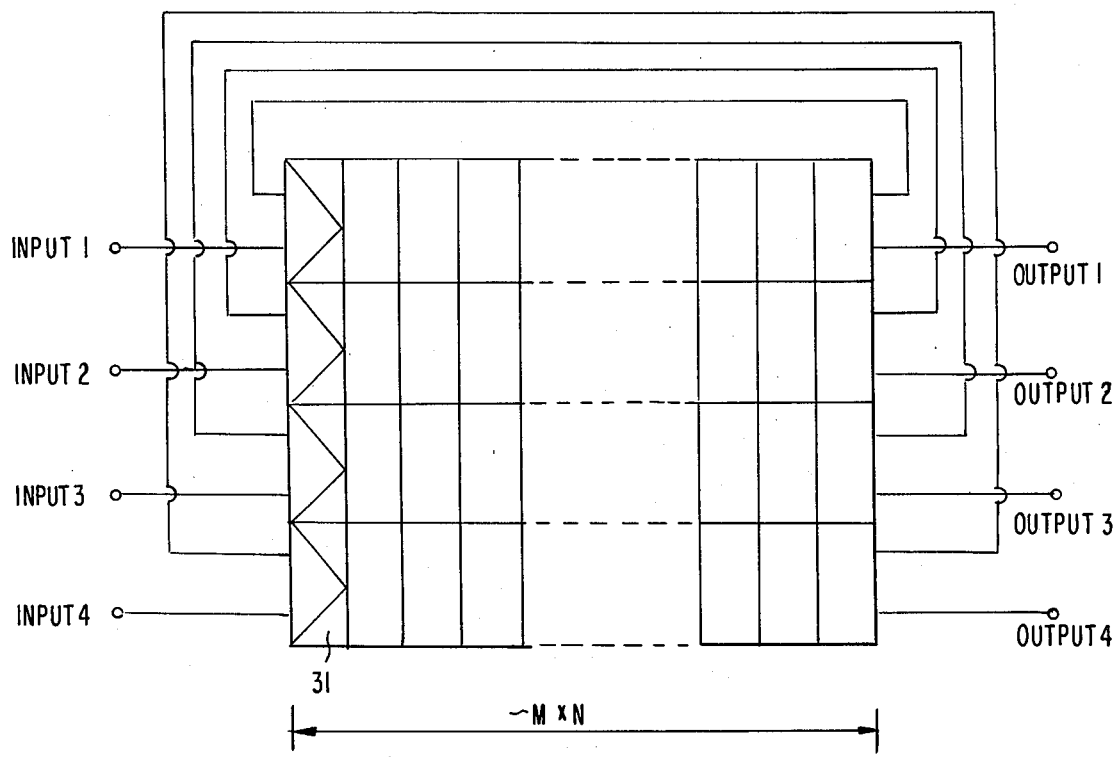
FIG. 17 is a schematic diagram showing a variable-length shift register.

With reference to the example shown in FIG. 17, in the arrangement having inputs 1 to 4 and outputs 1 to 4, in accessing the RAM, the memory cell currently being accessed, is a memory cell coupled to an output terminal and is also a bit corresponding to an input terminal. Of course, it is possible to simultaneously delay a plurality of bits by constructing a plurality of closed loops.

While four Y shift registers 23 are arrayed in parallel in FIG. 16, as a matter of course, a similar construction can be realized by arraying four X shift registers 22 in parallel. In this arrangement, the shift registers are made to have variable length by means of a shift length control signal LC.

Figure 18:
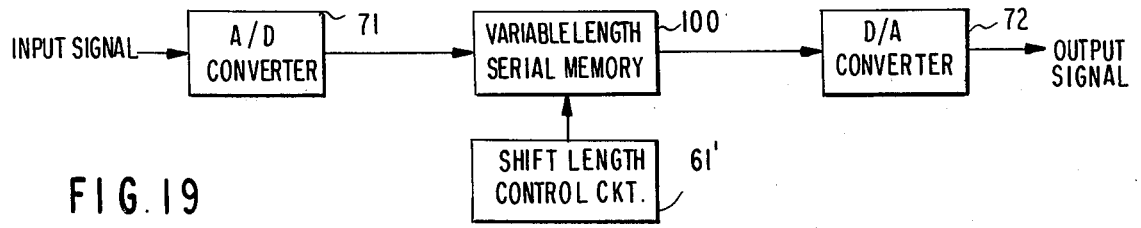
FIG. 18 is a schematic block diagram showing a further preferred embodiment of the present invention.

FIG. 18 shows one example of a combination of the above-described variable-length shift register 100, an A/D converter 71 and a D/A converter 72. A delay circuit capable of freely controlling a delay time for an analog signal such as a speech signal or a picture signal, is extremely effective. In the control of a delay time in the heretofore known delay circuits, the control was effected by varying a shift interval of a shift register. However, in the delay control system according to the present invention, since the control is effected by varying a length of a delay circuit, perfect control can be made without changing the quality of the signal passing through the delay circuit.

Figure 19:
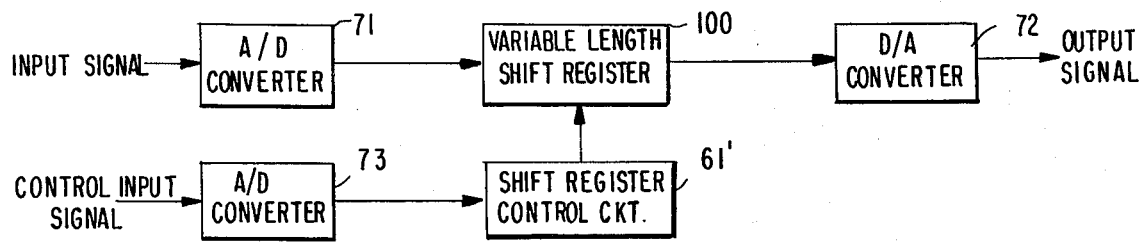
FIG. 19 is a schematic block diagram showing a still further preferred embodiment of the present invention, in which an A/D converter is connected to an input of a shift register length control circuit so that the shift register length can be controlled by an analog signal.
Figure 20:
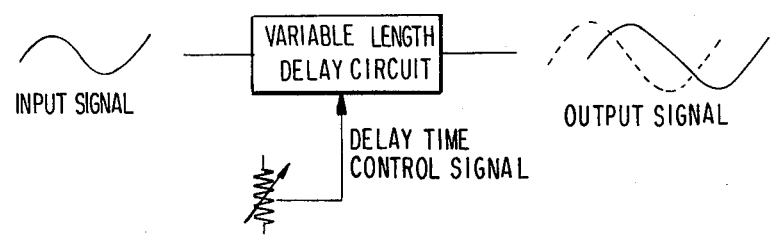
FIG. 20 is a schematic diagram to be used for explaining the operation of the circuit shown in FIG. 19.

FIG. 19 shows a further modification of the system shown in FIG. 18 such that an input signal to a shift register length control circuit 611 is also applied through an A/D converter 73. The system shown in FIG. 19 effectively has the function as illustrated in FIG. 20, and hence, the utility of this system will be immeasurably large in the field of the art employing analog signals such as speech signals, picture signals, etc.

I claim:

1. A memory device comprising memory cell array including a plurality of memory cells arrayed in rows and columns, a first shift register having a full shift length and having a plurality of outputs, the number of said outputs of said first shift register being not less than the number of said rows, first means responsive to a start signal for initializing the outputs of said first shift register so as to set only one output among the outputs of said first shift register at a selection level, second means responsive to the outputs of said first shift register for selecting one of said rows, third means for generating a shift length designation signal for designating a desired shift length which is shorter than said full shift length whereby a portion of said shift register outputs corresponding to said desired shift length will address a portion of said rows of said cell array, fourth means for supplying said first shift register with a train of shift signals to thereby shift a location of the set output of said first shift register, fifth means coupled to said third means and said fourth means for detecting when the location of said set output of said first shift register reaches a position of said first shift register corresponding to said desired shift length designated by said shift length designation signal, and sixth means coupled to said first means and said fifth means for producing said start signal upon the detection by said fifth means that said set output of said first register has reached said position corresponding to said desired shift length, whereby said portion of the rows of said cell array are sequentially addressed in synchronism with said shift signals.

2. The device according to claim 1, further comprising a second shift register having a plurality of outputs, the number of said outputs of said second shift register being not less than the number of said columns, and seventh means responsive to said outputs of said second shift register for selecting one of said columns.

3. The device according to claim 1 or 2, in which said third means includes a programmable memory.

4. The device according to claim 1 or 2, in which said third means includes a control terminal for receiving said shift length designation signal.

5. The device according to claim 1, further comprising a plurality of column shift registers, each of said column shift registers being associated with column groups, each of said column groups including a predetermined number of columns, and a plurality of column selection means, each of said column selection means being responsive to an associated one of said column shift registers for selecting one of said predetermined number of columns of an associated one of said column groups.

6. The device according to claim 5, further including means responsive to said start signal for setting said column shift registers at their initial state.

7. A memory device comprising a memory cell matrix including a plurality of memory cells arrayed in rows and columns, a first shift register whose outputs are used to designate one of said rows, a second shift register whose outputs are used to designate one of said columns, first means responsive to a start signal for initializing said first shift register so as to set only one of the outputs of said first shift register at a selection level, second means responsive to said start signal for initializing said second shift register so as to set only one of the outputs of said second shift register at the selection level, means for producing a train of first shift pulses, means for supplying said first shift register with said shift pulses, means responsive to a full shift of said first shift register for producing a second shift pulse, means for supplying said second shift register with said second shift pulse, generating means for generating shift length data for determining a stop position of the outputs of said first shift register which address a portion of said rows of said matrix, means for detecting when said selection level output of said first shift register reaches said stop position, said detecting means producing a detection signal upon detection that said selection level output of said first shift register has reached said stop position and means responsive to said detection signal for generating said start signal so as to return the position of the selection level from said stop position to the set output initialized by said first means, whereby a desired portion of the rows of said matrix from the initialized position of the said output to the stop position of said first shift register are sequentially addressed in accordance with the first shift pulses.

8. The device according to claim 7, in which said detecting means includes a counter for counting said first shift pulses and a comparator circuit for comparing the content of said counter with said shift length data.

9. The device according to claim 8, in which said programmable memory is a field programmable read only memory.

10. The device according to claim 7, in which said generating means includes a terminal for receiving said shift length data.

11. The device according to claim 7, further comprising input means for receiving input data to be written into a selected memory cell and output means for outputting data derived from a selected memory cell.

12. A memory device comprising a memory cell matrix including a plurality of memory cells arrayed in rows and columns, a first shift register whose outputs are used to designate one of sad rows, a second shift register whose outputs are used to designate one of said columns, first means responsive to a start signal for initializing said first shift register so as to set only one of the outputs of said first shift register at a selection level, second means responsive to said start signal for initializing said second shift register so as to set only one of the outputs of said second shift register at the selection level, means for producing a train of first shift pulses, means for supplying said first shift register with said shift pulses, means responsive to a full shift of said first shift register for producing a second shift pulse, means for supplying said second shift register with said second shift pulse, a programmable memory for generating shift length data for determining a stop position of the outputs of said first shift register which address a portion of said rows of said matrix, means for detecting when said selection level output of said first shift register reaches said stop position, said detecting means producing a detection signal upon detection that said selection level output of said first shift register has reached said stop position and means responsive to said detection signal for generating said start signal so as to return the position of the selection level from said stop position to the set output initialized by said first means, whereby a desired portion of the rows of said matrix from the initialized position of the said output to the stop position of said first shift register are sequentially addressed in accordance with the first shift pulses.

13. A memory device comprising a memory cell matrix including a plurality of memory cells arrayed in rows and columns, input means for receiving analog input data signals and converting said analog data input data signals to digital input data signals to be written into a selected memory cell, output means for receiving digital output data signals derived from a selected memory cell and converting said digital output data signals to analog data output signals, a first shift register whose outputs are used to designate one of said rows, a second shift register whose outputs are used to designate one of said columns, first means responsive to a start signal for initializing said first shift register to set only one of the outputs of said first shift register at a selection level, second means responsive to said start signal for initializing said second shift register so as to set only one of the outputs of said second shift register at the selection level, means for producing a train of first shift pulses, means for supplying said first shift register with said shift pulses, means responsive to a full shift of said first shift register for producing a second shift pulse, means for supplying said second shift register with said second shift pulse, generating means for generating shift length data for determining a stop position of the outputs of said first shift register which address a portion of said rows of said matrix, means for detecting when said selection level output of said first shift register reaches said stop position, said detecting means producing a detection signal upon detection that said selection level output of said first shift register has reached said stop position and means responsive to said detection signal for generating said start signal so as to return the position of the selection level from said stop position to the set output initialized by said first means, whereby a desired portion of the rows of said matrix from the initialized position of the said output to the stop position of said first shift register are sequentially addressed in accordance with the first shift pulses.

* * * * *

UNITED STATES PATENT AND TRADEMARK OFFICE
CERTIFICATE OF CORRECTION

PATENT NO. : 4,395,764
DATED : July 26, 1983
INVENTOR(S) : Shigeki Matsue

It is certified that error appears in the above-identified patent and that said Letters Patent is hereby corrected as shown below:

Column 8, line 59, delete "EP".

Column 9, line 50, delete "practiced".

Column 12, line 50, delete "8" and insert --12--.

Column 12, line 63, delete "sad" and insert --said--.

Signed and Sealed this

Twentieth Day of March 1984

[SEAL]

Attest:

GERALD J. MOSSINGHOFF

Attesting Officer

Commissioner of Patents and Trademarks